United States Patent
Kim et al.

(10) Patent No.: US 8,008,774 B2
(45) Date of Patent: Aug. 30, 2011

(54) MULTI-LAYER METAL WIRING OF SEMICONDUCTOR DEVICE PREVENTING MUTUAL METAL DIFFUSION BETWEEN METAL WIRINGS AND METHOD FOR FORMING THE SAME

(75) Inventors: Soo Hyun Kim, Seoul (KR); Baek Mann Kim, Kyoungki-do (KR); Young Jin Lee, Kyoungki-do (KR); Dong Ha Jung, Kyoungki-do (KR); Jeong Tae Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/754,776

(22) Filed: Apr. 6, 2010

(65) Prior Publication Data

US 2010/0193956 A1    Aug. 5, 2010

Related U.S. Application Data

(62) Division of application No. 11/755,390, filed on May 30, 2007, now abandoned.

(30) Foreign Application Priority Data

Dec. 28, 2006 (KR) .................. 10-2006-0137204

(51) Int. Cl.
*H01L 23/48* (2006.01)
*H01L 21/768* (2006.01)

(52) U.S. Cl. ........................................................ 257/751

(58) Field of Classification Search .......... 257/E21.575–E21.597, E21.627, 257/E21.641, 733, 374, 499–564, 763, 737, 257/751, E29.02, 774, 762, 200, 288, 298, 257/758, 776, 773; 438/582, 299, 15, 3, 438/669, 709, 730, 597, 448, 396, 253, 200, 438/656, 642, 638, 640, 627, 648, 622, 687, 438/485, 762, 639, 643, 637, 785

See application file for complete search history.

(56) References Cited

U.S. PATENT DOCUMENTS

| | | | | |
|---|---|---|---|---|
| 5,572,072 A | * | 11/1996 | Lee | 257/751 |
| 6,797,642 B1 | * | 9/2004 | Chu et al. | 438/758 |
| 2004/0203223 A1 | * | 10/2004 | Guo et al. | 438/637 |

* cited by examiner

*Primary Examiner* — Dao H Nguyen
*Assistant Examiner* — Tram H Nguyen
(74) *Attorney, Agent, or Firm* — Ladas & Parry LLP

(57) ABSTRACT

A multi-layer metal wiring of a semiconductor device and a method for forming the same are disclosed. The multi-layer metal wiring of the semiconductor device includes a lower Cu wiring, and an upper Al wiring formed to be contacted with the lower Cu wiring, and a diffusion barrier layer interposed between the lower Cu wiring and the upper Al wiring. The diffusion barrier layer is formed of a W-based layer.

14 Claims, 5 Drawing Sheets

MULTI-LAYER METAL WIRING OF SEMICONDUCTOR DEVICE PREVENTING MUTUAL METAL DIFFUSION BETWEEN METAL WIRINGS AND METHOD FOR FORMING THE SAME

CROSS-REFERENCE TO RELATED APPLICATIONS

The present application claims priority to Korean patent application number 10-2006-0137204 filed on Dec. 28, 2006, which is incorporated herein by reference in its entirety.

BACKGROUND OF THE INVENTION

The present invention relates to a method for forming a multi-layer metal wiring of a semiconductor device, and more particularly to a multi-layer metal wiring of a semiconductor device including a diffusion barrier layer for preventing mutual metal diffusion between upper and lower metal wirings mutually contacted and a method for forming the same.

For highly integrated semiconductor devices, high speed device components are required such that the memory cells are formed in a stack structure. Further, the metal wirings carrying electrical signals to each cell are also formed in a multi-layer structure. The metal wiring laid out in a multi-layer structure provides advantageous design flexibility and allows more leeway in setting the margins for the metal wiring resistance, the current capacity, etc.

Generally, aluminum (Al) has been the choice of metal wiring for its superior electric conductivity and the ease of being applied in a fabrication process. However, copper (Cu) is preferred over Al in products operating in faster speeds and requiring lower operational voltages due to high integration of semiconductor devices, because Cu has relatively lower resistance than Al.

However, it is not preferable to apply only Cu as the material for all metal wirings formed in a multi-layer structure due to increased manufacturing expenses and certain unsuitable characteristics that could be present in the highly integrated device components. Along these lines, Cu were used as the metal wiring material in a multi-layer structure when high speed is important, and Al were used when the speed is relatively less important.

Meanwhile, when Cu is used as the lower metal wiring and Al is used as the upper metal wiring in a multi-layer metal wiring structure, a diffusion barrier layer between the lower and upper metal wirings is necessary to prevent metal diffusion between the metal wirings.

Generally, in a multi-layer metal wiring structure having a lower wiring of Cu and an upper wiring of Al, a Ti layer and/or a TiN layer (i.e., either individually or as a stacked layer) were used as the diffusion barrier layer between the lower and upper metal wirings. However, the diffusion barrier layer made of stacked Ti and TiN layers cannot secure the thickness needed to sufficiently suppress the metal diffusion between the metal wirings.

It is not impossible to increase the thickness of the Ti and/or TiN layers to suppress the metal diffusion between the lower Cu wiring and the upper Al wiring; however, this only leads to reduction of the sectional area of the Al upper wiring, which is formed in a damascene pattern, and thereby causes the undesirable increase of the metal wiring resistance.

Also, when the thickness of the stacked Ti and TiN layers is increased, filling Al in a via hole in the damascene pattern to form a upper metal wiring would become more difficult such that voids may be generated in the via hole leading to the significantly increased metal wiring resistance.

Therefore, increasing the thickness of the stacked Ti and TiN layers for purposes of suppressing the metal diffusion between the lower Cu wiring and the upper Al wiring is impractical for use.

BRIEF SUMMARY OF THE INVENTION

Embodiments of the present invention provide a multi-layer metal wiring of a semiconductor device preventing the mutual metal diffusion between an upper and a lower metal wirings mutually contacted, and a method forming the same.

In one embodiment, a multi-layer metal wiring of a semiconductor device includes; a lower Cu wiring; an upper Al wiring formed to be contacted with the lower Cu wiring; and a diffusion barrier layer interposed between the lower Cu wiring and the upper Al wiring and formed of a W-based layer.

The W-based layer is formed of a WN layer.

The WN layer has a thickness of 50 to 200 Å.

The W-based layer is formed of a stacked layer of a W layer and a WN layer.

The stacked layer of the W layer and the WN layer has a thickness of 50 to 300 Å.

The W-based layer is formed of a WSiNy layer.

The WSiNy layer has a thickness of 50 to 200 Å.

The W-based layer is formed of a stacked layer of a WSix layer and a WSixNy layer.

The stacked layer of the WSix layer and the WSixNy layer has a thickness of 50 to 300 Å.

In the multi-layer metal wiring of the semiconductor device, the upper Al wiring includes an Al nucleation growth layer formed on the diffusion barrier layer.

The Al nucleation growth layer has a thickness of 50 to 500 Å.

In the other embodiment, a method for forming a multi-layer metal wiring of a semiconductor device include: forming a lower Cu wiring over the upper of the semiconductor substrate on which an underlayer is formed; and forming an upper Al wiring by interposing a diffusion barrier layer over the lower Cu metal wiring, wherein the diffusion barrier layer is formed of a W-based layer.

The W-based layer is formed of a WN layer.

The WN layer has a thickness of 50 to 200 Å.

The WN layer is formed in an ALD method or a CVD method.

The WN layer is formed under the conditions of the temperature of 200 to 400° C. and the pressure of 1 to 40 Torr.

The W-based layer is formed of a stacked layer of a W layer and a WN layer.

The stacked layer of the W layer and the WN layer has a thickness of 50 to 300 Å.

The formation of the stacked layer of the W layer and the WN layer includes the steps of depositing the W layer and nitrifying the surface of the W layer.

The W layer is deposited based on a ALD method or a CVD method.

The W layer is deposited under the conditions of the temperature of 200 to 400° C. and the pressure of 1 to 40 Torr.

The nitrification on the surface of the W layer is performed by a heat treatment or a plasma treatment under the atmosphere of any one of $NH_3$, $N_2H_4$, $N_2$, and $N_2/H_2$.

The W-based layer is formed of a WSiNy layer.

The WSiNy layer has a thickness of 50 to 200 Å.

The WSiNy layer is formed based on an ALD method or a CVD method.

The WSiNy layer is formed under the conditions of the temperature of 300 to 500° C. and the pressure of 0.01 to 10 Torr.

The W-based layer is formed of a stacked layer of a WSix layer and a WSiNy layer.

The stacked layer of the WSix layer and the WSiNy layer has a thickness of 50 to 300 Å.

The formation of the stacked layer of the WSix layer and the WSiNy layer includes the steps of depositing the WSix layer and nitrifying the surface of the WSix layer.

The WSix layer is deposited in a ALD method or a CVD method.

The WSix layer is deposited under the conditions of the temperature of 300 to 500° C. and the pressure of 0.01 to 10 Torr.

The nitrification on the surface of the WSix layer is performed by a heat treatment or a plasma treatment under the atmosphere of any one of $NH_3$, $N_2H_4$, $N_2$, and $N_2/H_2$.

The method for forming the multi-layer metal wiring of the semiconductor device includes forming a Al nucleation growth layer on the diffusion barrier layer prior to forming the upper Al wiring.

The Al nucleation growth layer has a thickness of 50 to 500 Å based on a CVD method.

The method for forming the upper Al wiring includes the steps of depositing the Al layer over the diffusion barrier layer based on a PVD method at the temperature of 200 to 400° C., and performing a heat treatment on the Al layer at the temperature of 400 to 500° C.

The method for forming the upper Al wiring includes the steps of depositing a first Al layer over the diffusion barrier layer based on a PVD method at the temperature of 150 to 200° C., and depositing a second Al layer over the first Al layer based on a PVD method at the temperature of 200 to 450° C.

DESCRIPTION OF SPECIFIC EMBODIMENTS

The present invention forms a diffusion barrier layer of a W-based layer. The W-based diffusion barrier layer is inserted in the contact interface between a lower Cu wiring and an upper Al wiring. Preferably, the W-based layer is formed of a WN layer, a stacked layer of a W layer and the WN layer, a WSiNy layer, or a stacked layer of the WSix layer and a WSiNy layer.

The W-based layer has very excellent diffusion barrier characteristics as compared to a Ti layer and TiN layer, which are conventional diffusion barrier layers. The W-based diffusion barrier layer has excellent capability to suppress the metal diffusion between the lower Cu wiring and the upper Al wiring. Therefore, when forming a multi-layer metal wiring to which the lower Cu wiring and the upper Al wiring is formed in an ultra high integration device, the present invention provides an excellent diffusion barrier layer capable of suppressing the metal diffusion between the upper and lower metal wirings as well as suppressing the generation of metal compounds with high resistance due to the metal diffusion mutually between the metal wirings.

Therefore, the present invention can suppress the generation of the metal compounds with high resistance due to the metal diffusion between the metal wirings, making it possible to improve the device performance characteristics and reliability. Also, the present invention provides a diffusion barrier layer of thinner thickness than the conventional barrier layer of the stacked Ti and TiN layers, thereby reducing the contact resistance.

Hereinafter, the method for forming a multi-layer metal wiring of a semiconductor device according to an embodiment of the present invention will be described in detail with reference to FIGS. 1A through 1E.

Figure 1A:
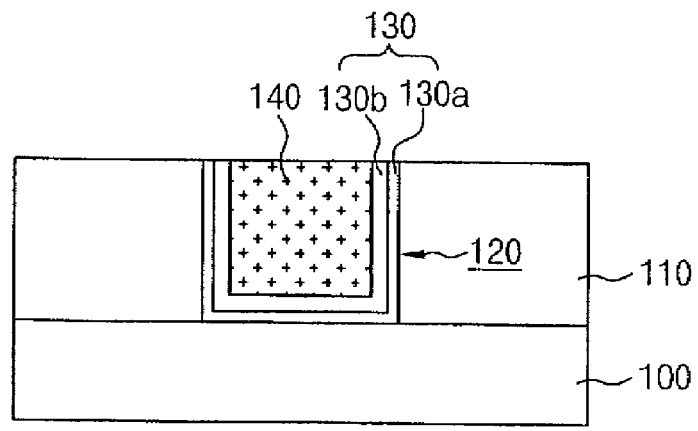
FIGS. 1A through 1E are cross-sectional views for explaining a method for forming a multi-layer metal wiring of a semiconductor device in accordance with an embodiment of the present invention.

Referring to FIG. 1A, a first interlayer insulating layer 110 is formed over the a semiconductor substrate 100 on which an underlayer (not shown) is formed and then etched to form a trench 120 defining a region for forming a lower metal wiring 140. A first diffusion barrier layer 130 is formed over the first interlayer insulating layer 110 including the trench 120. The first diffusion barrier layer 130 is formed of a stacked layer of a Ta layer 130a and a TaN layer 130b.

A Cu seed layer is deposited over the first diffusion barrier layer 130. The Cu layer is deposited over the Cu seed layer with an electroplating method so that the trench 120 is filled. The lower Cu wiring 140 is formed in the trench 120 by etching the Cu layer and the first diffusion barrier layer 130 so that the first interlayer insulating layer 110 outside the trench 120 is exposed.

Figure 1B:
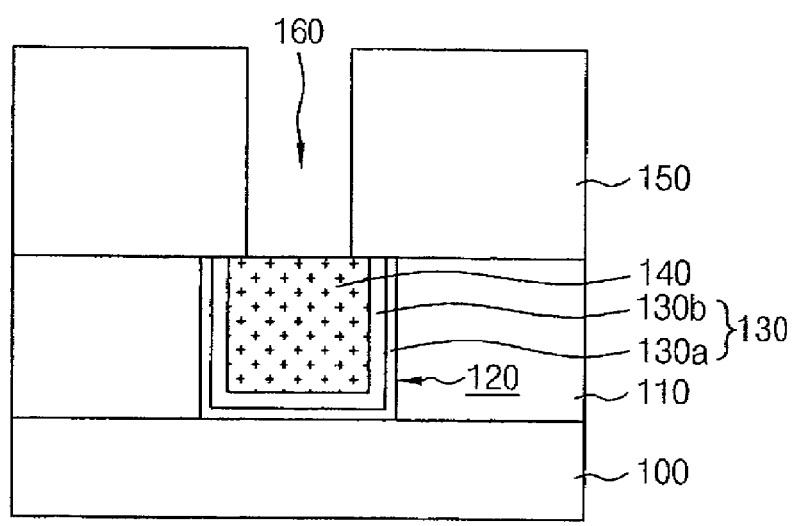

Referring to FIG. 1B, a second interlayer insulating layer 150 is formed over the first interlayer insulating layer 120 including the lower Cu wiring 140, and then the second interlayer insulating layer 150 is etched to form a contact hole 160 exposing the lower Cu wiring 140.

Figure 1C:
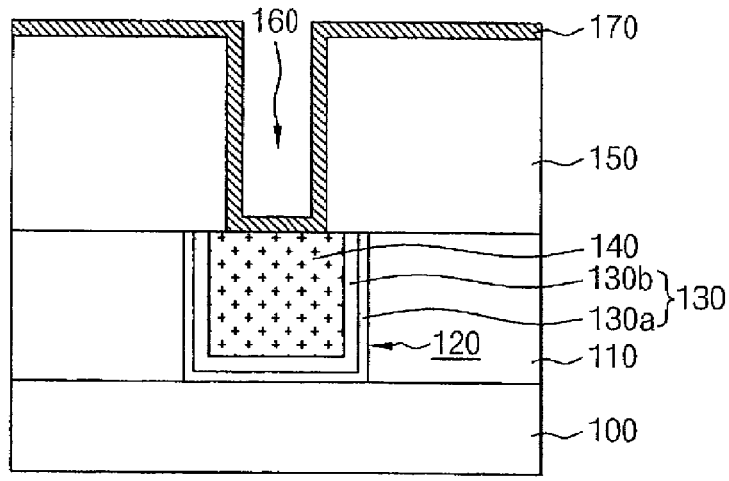

Referring to FIG. 1C, a second diffusion barrier layer 170 for preventing the mutual metal diffusion between the lower Cu wiring 140 and a upper metal wiring (to be formed in the contact hole 160) is formed over the second interlayer insulating layer 150 including the contact hole 160. The second diffusion barrier layer 170 is formed of a tungsten-based (or W-based) layer. For example, the W-based layer would include a WN layer or a stacked layer of W and WN layers or a WSiNy layer or a stacked layer of WSix and WSiNy layers or the like.

Figure 1D:
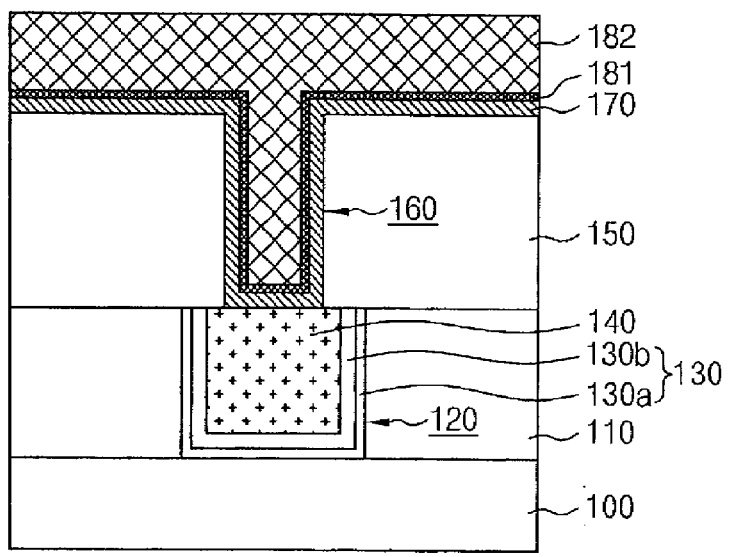

Referring to FIG. 1D, an Al nucleation growth layer 181 is formed over the W-based second diffusion barrier layer 170 by a deposition method such as a chemical vapor deposition (CVD). The Al nucleation growth layer 181 is formed to have a thickness of 50 to 500 Å.

A wiring 182 of Al layer is formed on the Al nucleation growth layer 181 such that the contact hole 160 is filled. For example, the Al layer for wiring 182 is formed by depositing Al at a temperature in the range of 200 to 400° C. by a deposition method such as a physical vapor deposition (PVD) and by performing a heat treatment on the Al layer at a temperature in the range of 400 to 500° C.

Similarly, for example, the Al layer for wiring 182 can be formed as a stacked layer of a first Al layer and a second Al layer by depositing the first Al layer at a temperature in the range of 150 to 200° C. by a PVD method and depositing the second Al layer over the first Al layer at a temperature in the range of 200 to 450° C. also by a PVD method.

Figure 1E:
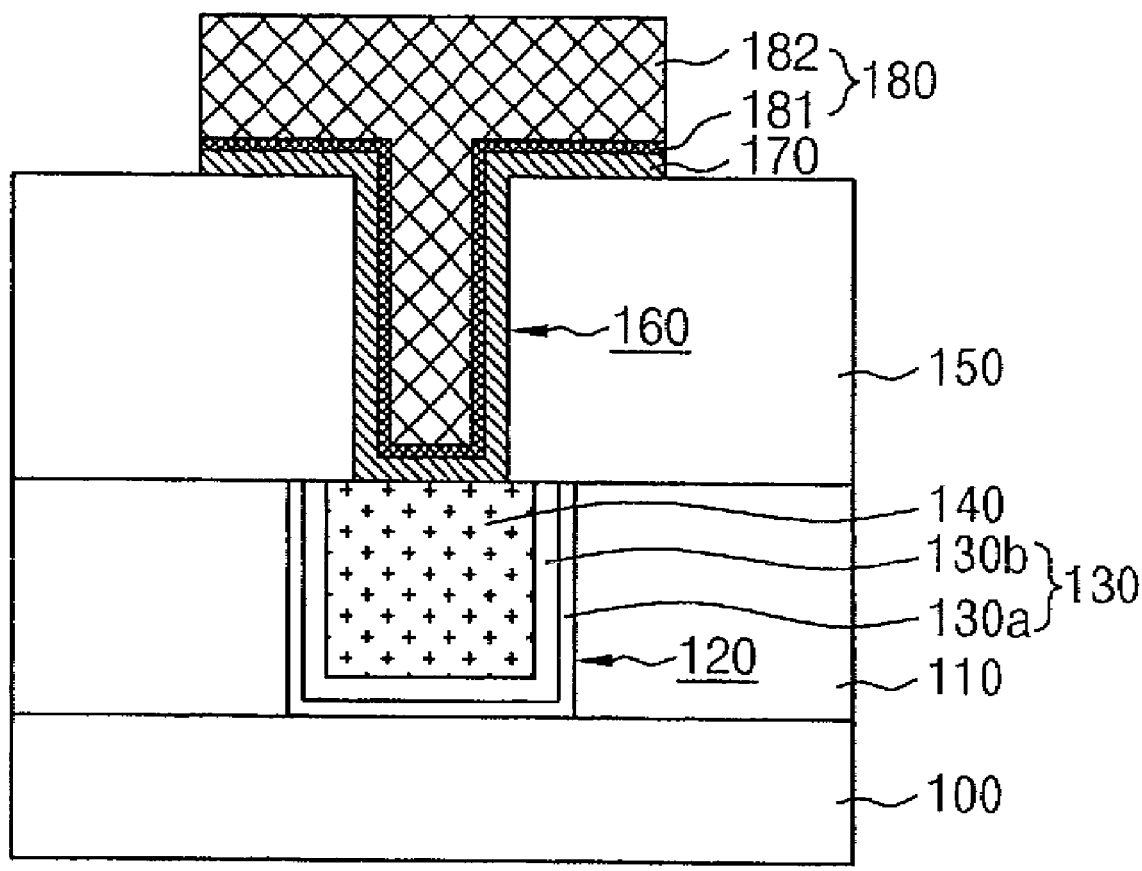

Referring to FIG. 1E, the Al layer for upper wiring 182 and the W-based second diffusion barrier layer 170 are etched to form a upper Al wiring 180 contacting the lower Cu wiring 140, thereby forming a multi-layer metal wiring of a semiconductor device according to an embodiment of the present invention.

Figure 2:
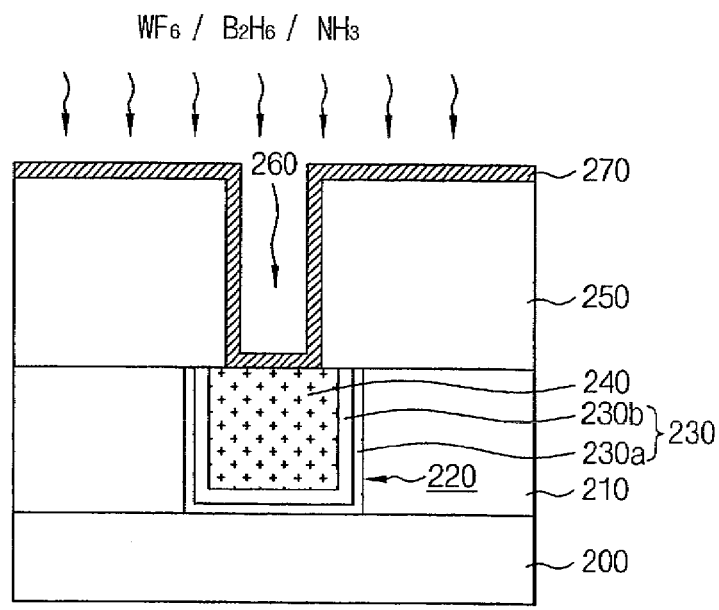
FIG. 2 is a cross-sectional view for explaining a method for forming a WN layer as a diffusion barrier layer in accordance with a first embodiment of the present invention.

FIG. 2 is a cross-sectional view for explaining a method for forming a WN layer as a second diffusion barrier layer in accordance with a first embodiment of the present invention. As shown, a WN layer 270 is formed to a thickness of 50 to 200 Å over a second interlayer insulating layer 250 having the contact hole 260 by an atomic layer deposition (ALD) or CVD method.

For example, the WN layer 270 is formed by supplying one or more gases in combinations of $B_2H_6$, $WF_6$, and $NH_3$ under a temperature in the range of 200 to 400° C. and a pressure in the range of 1 to 40 Torr. One or more gases in combination of $B_{10}H_{14}$, $SiH_4$, and $Si_2H_6$, besides or in addition to $B_2H_6$, can be used when forming the WN layer 270.

Further, the WN layer 270 can also be formed by depositing a W layer to a thickness of 10 to 100 Å by supplying the gases of $B_2H_6$ and $WF_6$, and then changing the W layer into the WN layer by supplying the gases of $B_2H_6$ and $NH_3$, thereby depositing the WN layer. The W layer can be formed by using any one of gas $B_{10}H_{14}$, $SiH_4$, and $Si_2H_6$, besides the gas of $B_2H_6$.

In FIG. 2, the reference numeral 200 represents a semiconductor substrate; 210 represents a first interlayer insulating layer; 230a represents a Ta layer; 230b represents a TaN layer; 230 represents a first diffusion barrier layer; and 240 represents a lower Cu wiring.

Figure 3:
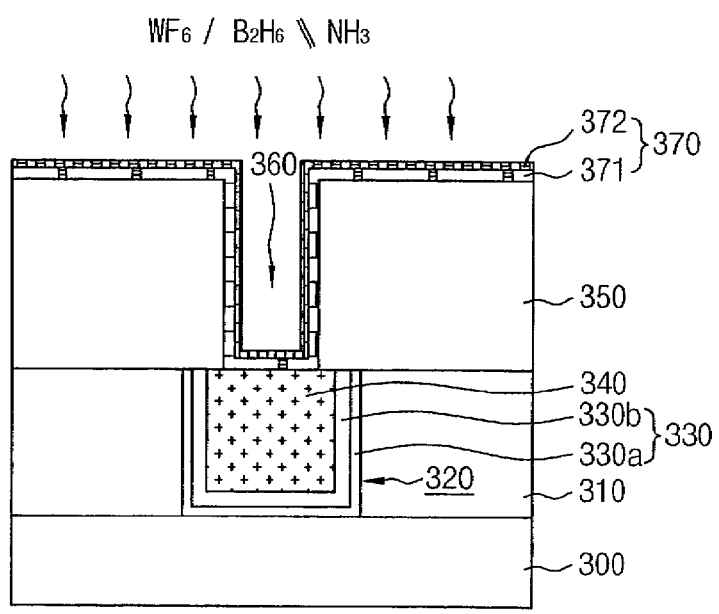
FIG. 3 is a cross-sectional view for explaining a method for forming a stacked layer of a W layer and a WN layer as a diffusion barrier layer in accordance with a second embodiment of the present invention.

FIG. 3 is a cross-sectional view for explaining a method for forming a stacked layer of a W layer and a WN layer as a second diffusion barrier layer in accordance with a second embodiment of the present invention. As shown, a stacked layer 370 of a W layer 371 and a WN layer 372 is formed to a thickness of 50 to 300 Å by first depositing the W layer 371 over the second interlayer insulating layer 350 having the contact hole 360 by an ALD or CVD method, and then nitrifying the surface of the W layer 371.

For example, the method for forming the stacked layer 370 of the W layer 371 and WN layer 372 is formed by forming the WN layer 372 on the surface of the W layer 371 by first supplying the gas of $WF_6$ and $B_2H_6$ under a temperature in the range of 200 to 400° C. and a pressure in the range of 1 to 40 Torr to deposit the W layer 371 and then nitrifying the surface of the W layer 371 under the atmosphere of $NH_3$.

The W layer 371 can be deposited by using any one of gas of $B_{10}H_{14}$, $SiH_4$, and $Si_2H_6$ besides the gas of $B_2H_6$. The nitrification on the surface of the W layer 371 can be performed by using the gas of $N_2H_4$ besides the gas of $NH_3$, and further the nitrification can be performed by supplying a radical including N by forming $N_2$ and $N_2/H_2$ plasma.

Meanwhile, the nitrification on the surface of the W layer 371 may be performed by raising the temperature of the semiconductor substrate or may be performed by a heat treating process for an efficient nitrification processing.

In FIG. 3, the reference numeral 300 represents a semiconductor substrate; 310 represents a first interlayer insulating layer; 330a represents a Ta layer; 330b represents a TaN layer; 330 represents a first diffusion barrier layer; and 340 represents a lower Cu wiring.

Figure 4:
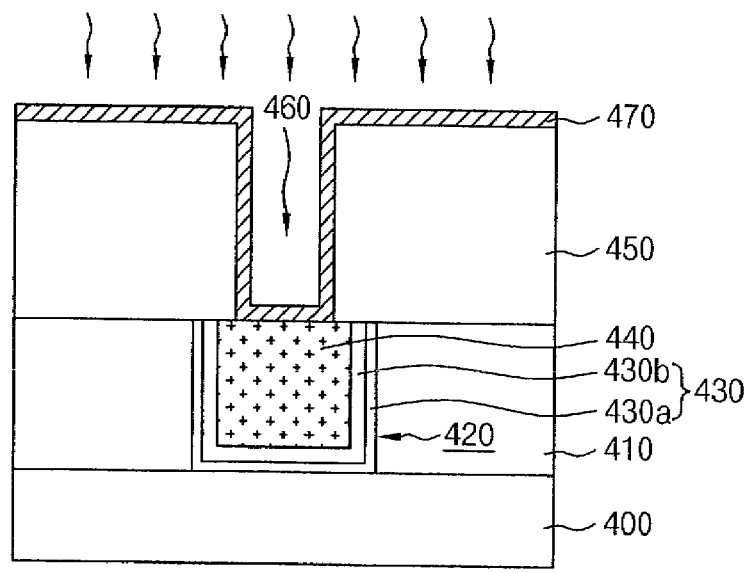
FIG. 4 is a cross-sectional view for explaining a method for forming a WSix layer as a diffusion barrier layer in accordance with a third embodiment of the present invention.

FIG. 4 is a cross-sectional view for explaining a method for forming a WSixNy layer as a second diffusion barrier layer in accordance with a third embodiment of the present invention. As shown, the WSixNy layer 470 is formed to a thickness of 50 to 300 Å over the second interlayer insulating layer 450 having the contact hole 460 by an ALD or CVD method.

For example, the WSixNy layer 470 is formed by supplying one or more gases in combination of $WF_6$, $B_2H_6$, $SiH_4$, and $NH_3$ under a temperature in the range of 300 to 500° C. and a pressure of 0.01 to 10 Torr. The WSixNy layer 470 can be formed in a cycle of $B_2H_6$ supply-$B_2H_6$ purge-$WF_6$ supply-$WF_6$ purge-$SiH_4$ supply-$SiH_4$ purge-$NH_3$ supply-$NH_3$ purge or in a cycle of $WF_6$ supply-$WF_6$ purge-$B_2H_6$ supply-$B_2H_6$ purge-$SiH_4$ supply-$SiH_4$ purge-$NH_3$ supply-$NH_3$ purge.

The WSixNy layer 470 can be formed by using one or more gases of $BH_3$ and $B_{10}H_{14}$ besides the gas of $B_2H_6$, and can be formed by using one or more gases of $Si_2H_6$ and $SiH_2Cl_2$ besides the gas of $SiH_4$.

In FIG. 4, the reference numeral 400 represents a semiconductor substrate; 410 represents a first interlayer insulating layer; 430a represents a Ta layer; 430b represents a TaN layer; 430 represents a first diffusion barrier layer; and 440 represents a lower Cu wiring.

Figure 5:
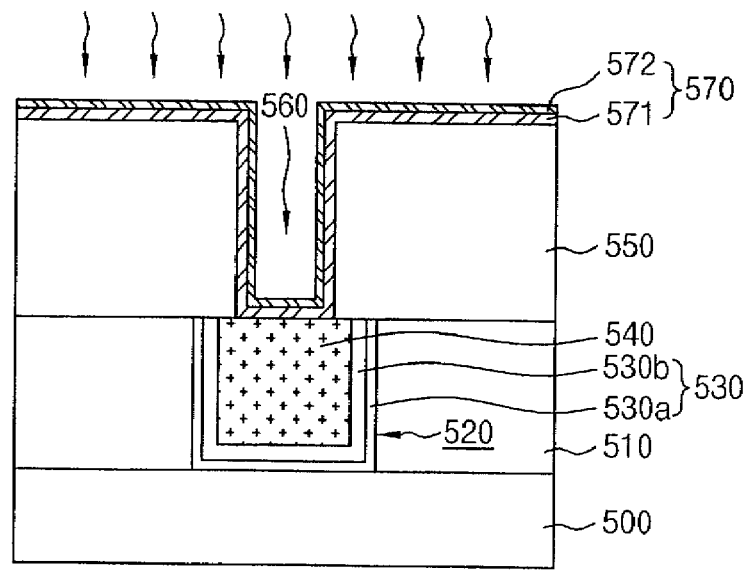
FIG. 5 is a cross-sectional view for explaining a method for forming a stacked layer of a WSix layer and a WSixNy layer as a diffusion barrier layer in accordance with a fourth embodiment of the present invention.

FIG. 5 is a cross-sectional view for explaining a method for forming a stacked layer of a WSix layer and a WSixNy layer as a second diffusion barrier layer in accordance with a fourth embodiment of the present invention. As shown, a stacked layer 570 of the WSix layer 571 and the WSixNy layer 572 is formed to a thickness of 50 to 300 Å by depositing the WSix layer 571 over the second interlayer insulating layer 550 having the contact hole 560 by an ALD or CVD method and nitrifying the surface of the WSix layer 571.

For example, the method for forming the stacked layer 570 of the WSix layer 571 and WSixNy layer 572 is formed by forming the WSixNy layer 572 on the surface of the WSix layer 571 by first supplying one or more gases in combination of $WF_6$, $B_2H_6$ and $SiH_4$ to deposit the WSix layer 571 under a temperature in the range of 300 to 500° C. and a pressure in the range of 0.01 to 10 Torr and then nitrifying the surface of the WSix layer 571 under the atmosphere of $NH_3$.

The WSix layer 571 can be deposited by using a gas of $BH_3$ or $B_{10}H_{14}$ besides the gas of $B_2H_6$ and using a gas of $Si_2H_6$ or $SiH_2Cl_2$ besides the gas of $SiH_4$. The nitrification on the surface of the WSix layer 571 can be performed by using the gas of $N_2H_4$ besides the gas of $NH_3$ and can be performed by supplying a radical including N by forming $N_2$ and $N_2/H_2$ plasma.

Meanwhile, the nitrification on the surface of the WSix layer 571 can be performed by raising the temperature of the semiconductor substrate 500 and can be performed by a heat treating process for an efficient nitrification processing.

In FIG. 5, the reference numeral 510 represents a first interlayer insulating layer; 530a represents a Ta layer; 530b represents a TaN layer; 530 represents a first diffusion barrier layer; and 540 represents a lower Cu wiring.

As described above, the present invention uses the W-based layer as the diffusion barrier layer between the lower Cu wiring and the upper Al wiring. The W-based layer has excellent diffusion barrier characteristics as compared to the conventional diffusion barrier such as the stacked layer of the Ti layer and the TiN layer, effectively suppressing the metal diffusion between the lower Cu wiring contacting the upper Al wiring.

As described above, when forming a multi-layer metal wiring structure having the lower Cu wiring contacting the upper Al wiring in an ultra high integration device, the present invention provides an excellent diffusion barrier for effectively suppressing the metal diffusion between the upper and lower metal wirings. The present invention also suppresses the high resistance metal compounds from being generated through the metal diffusion between the metal wirings, thereby improving the device reliability and performance characteristics.

Also, the present invention provides a thinner diffusion barrier than the conventional diffusion barrier layer of the stacked Ti and TiN layers, thereby lowering the contact resistance.

Although a specific embodiments of the present invention has been described for illustrative purposes, those skilled in the art will appreciate that various modifications, additions and substitutions are possible, without departing from the scope and the spirit of the invention as disclosed in the accompanying claims.

What is claimed is:

1. A multi-layer metal wiring of a semiconductor device comprising:
    a lower Cu wiring;
    an upper Al wiring formed over the lower Cu wiring and electrically contacting the lower Cu wiring; and
    a W-based diffusion barrier layer formed between the lower Cu wiring and the upper Al wiring, wherein the W-based diffusion barrier layer comprises a stacked layer of a WSix layer and a WSixNy layer.

2. The multi-layer metal wiring of the semiconductor according to claim 1, wherein the stacked layer of the WSix layer and the WSixNy layer has a thickness of 50 to 300 Å.

3. The multi-layer metal wiring of the semiconductor according to claim 1, wherein the upper Al wiring comprises an Al nucleation growth layer formed on the diffusion barrier layer.

4. The multi-layer metal wiring of the semiconductor according to claim 3, wherein the Al nucleation growth layer has a thickness of 50 to 500 Å.

5. A method for forming a multi-layer metal wiring of a semiconductor device including:
    forming a lower Cu wiring over a semiconductor substrate;
    forming a w-based diffusion barrier layer on the lower Cu wiring, wherein the W-based diffusion barrier layer comprises a stacked layer of a $WSi_x$ layer and a $WSiN_y$ layer; and
    forming an upper Al wiring over the lower Cu wiring including the W-based diffusion barrier layer.

6. The method for forming the multi-layer metal wiring of the semiconductor device according to claim 5, wherein the stacked layer of the WSix layer and the WSiNy layer has a thickness of 50 to 300 Å.

7. The method for forming the multi-layer metal wiring of the semiconductor device according to claim 5, wherein the stacked layer of the WSix layer and the WSiNy layer is formed by depositing the WSix layer and nitrifying the surface of the WSix layer.

8. The method for forming the multi-layer metal wiring of the semiconductor device according to claim 5, wherein the WSix layer is deposited in an ALD or CVD method.

9. The method for forming the multi-layer metal wiring of the semiconductor device according to claim 7, wherein the WSix layer is deposited under a temperature in the range of 300 to 500° C. and a pressure in the range of 0.01 to 10 Torr.

10. The method for forming the multi-layer metal wiring of the semiconductor device according to claim 7, wherein the nitrification on the surface of the WSix layer is performed by a heat treatment or a plasma treatment under the atmosphere of any one of $NH_3$, $N_2H_4$, $N_2$, and $N_2/H_2$.

11. The method for forming the multi-layer metal wiring of the semiconductor device according to claim 5 further comprising forming a Al nucleation growth layer on the diffusion barrier layer prior to forming the upper Al wiring.

12. The method for forming the multi-layer metal wiring of the semiconductor device according to claim 11, wherein the Al nucleation growth layer has a thickness of 50 to 500 Å based on a CVD method.

13. The method for forming the multi-layer metal wiring of the semiconductor device according to claim 5 comprising:
    the method for forming the upper Al wiring includes the steps of depositing the Al layer over the diffusion barrier layer based on a PVD method at a temperature in the range of 200 to 400° C.; and,
    performing a heat treatment on the Al layer at a temperature in the range of 400 to 500° C.

14. The method for forming the multi-layer metal wiring of the semiconductor device according to claim 5 comprising:
    the method for forming the upper Al wiring comprising the step of depositing a first Al layer over the diffusion barrier layer in a PVD method at a temperature in the range of 150 to 200° C.; and
depositing a second Al layer over the first Al layer in a PVD method at a temperature in the range of 200 to 450° C.

* * * * *